United States Patent [19]

Matsuki et al.

[11] Patent Number: 5,760,410
[45] Date of Patent: Jun. 2, 1998

[54] ELECTRON BEAM LITHOGRAPHY APPARATUS AND METHOD

[75] Inventors: Kazuto Matsuki, Tokyo; Shuichi Tamamushi, Kawasaki; Toshio Yamaguchi, Numazu; Ryoichi Yoshikawa, Kawasaki, all of Japan

[73] Assignee: Kabushiki Kaisha Toshiba, Kawasaki, Japan

[21] Appl. No.: 842,508

[22] Filed: Apr. 24, 1997

[30] Foreign Application Priority Data

Apr. 26, 1996 [JP] Japan .................... 8-107952

[51] Int. Cl.⁶ .................................... H01J 37/302
[52] U.S. Cl. .................... 250/492.22; 250/398
[58] Field of Search ................ 250/492.22, 398, 250/492.23, 492.2

[56] References Cited

U.S. PATENT DOCUMENTS

| | | | |
|---|---|---|---|
| 5,305,225 | 4/1994 | Yamaguchi et al. | 364/474.02 |
| 5,313,068 | 5/1994 | Meiri et al. | 250/492.22 |
| 5,334,282 | 8/1994 | Nakayama | 250/492.2 |
| 5,451,487 | 9/1995 | Abe et al. | 250/492.2 |

*Primary Examiner*—Kiet T. Nguyen
*Attorney, Agent, or Firm*—Oblon, Spivak, McClelland, Maier & Neustadt, P.C.

[57] ABSTRACT

An electron beam lithography apparatus is provided for drawing a exposure pattern on a sample by dividing the exposure pattern into a plurality of pattern elements and individually directing the electron beam to the sample at the pattern element. The size of the pattern element is adjusted in accordance with a gradient of a spatial variation of a back scattering dose. By doing so, it is possible to suppress distortion at the exposure area of one shot and to suppress an uneven edge of an exposure area row. If the size of the pattern element is made uniformly smaller, the drawing throughput is markedly lowered. The sizes of the pattern element varies in accordance with the gradient of a spatial variation of the back scattering dose and it is, therefore, possible to suppress a fall in the drawing throughput.

38 Claims, 9 Drawing Sheets

$$D = D_1 \times (1-t) \times (1-s)$$
$$+ D_2 \times (1-t) \times s$$
$$+ D_3 \times t \times (1-s)$$
$$+ D_4 \times t \times s$$

FIG. 15

| TOTAL EXPOSURE TIME (nsec) | EXPOSURE TIME FOR NOT LAST SHOT (nsec) | EXPOSURE TIME FOR LAST SHOT (nesc) |
|---|---|---|
| 220 | 55 | 55 |
| 215 | 50 | 65 |
| 210 | 50 | 60 |
| 205 | 50 | 55 |
| 200 | 50 | 50 |

BLANKING QUANTIZATION WIDTH : 5nsec

SHOT TIME : 4

215nsec=50nsec×(4-1)+65nsec

FIG. 16

ELECTRON BEAM LITHOGRAPHY APPARATUS AND METHOD

BACKGROUND OF THE INVENTION

In recent years, an electron beam lithography apparatus has been used as an apparatus for drawing patterns on a sample, such as a semiconductor wafer and a mask substrate. In the electron beam lithography apparatus, there arises a "proximity effect", that is, an appearance of a thin or thick pattern resulting from back scattering. In order to alleviate such a proximity effect, an exposure dose correction method has been used.

Figure 1:
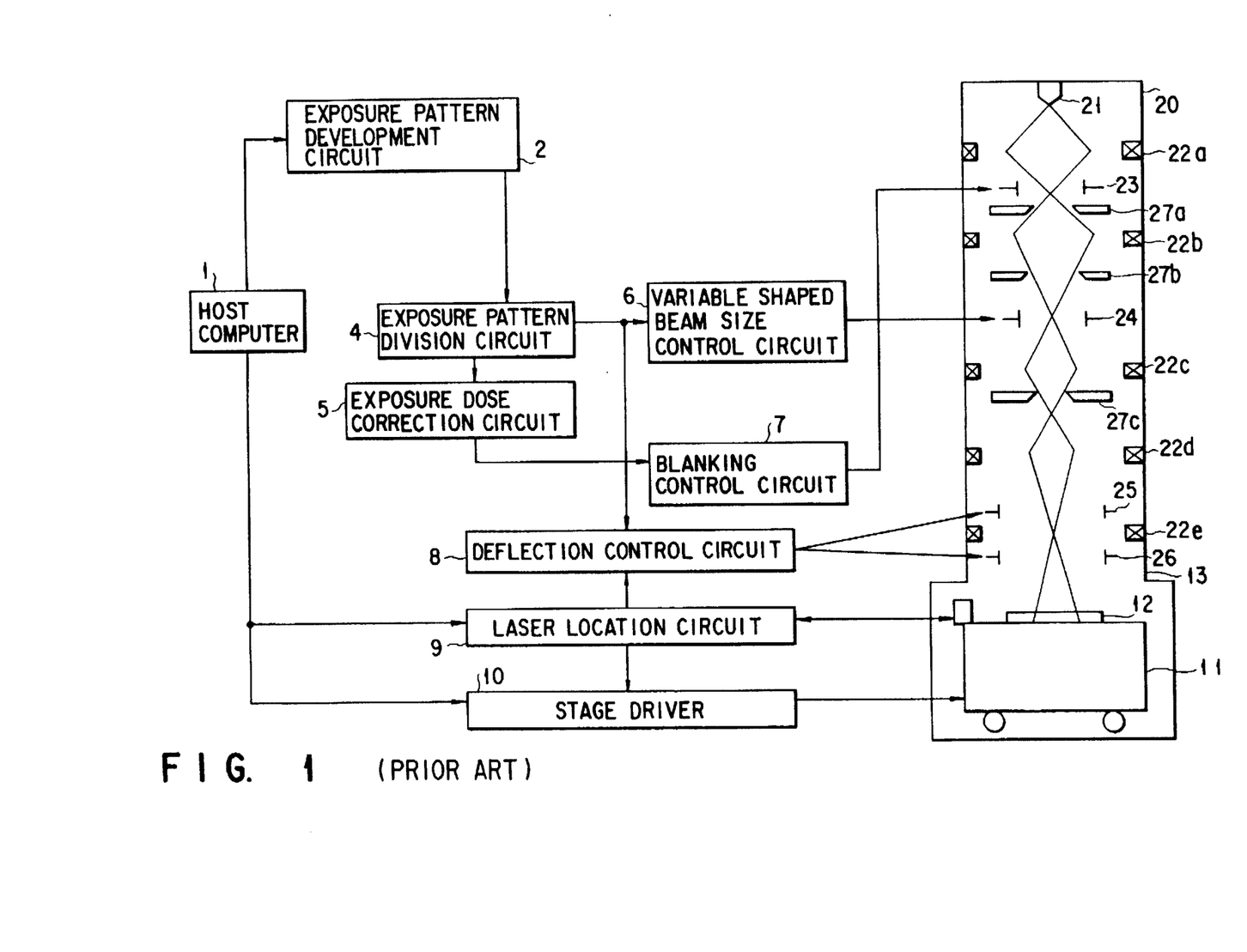
FIG. 1 is a block diagram showing an arrangement of a conventional electron beam lithography apparatus.

With reference to FIG. 1. explanation will be given below about the conventional electron beam lithography apparatus having such a correction function. Reference numeral 1 shows a host computer; 2, a exposure pattern development circuit; 4, a exposure pattern division circuit; 5, an exposure dose correction circuit; 6, a variable shaped beam size control circuit; 7, a blanking control circuit; 8, a deflection control circuit; 9, a laser location circuit; 10, a stage driver; 11, a stage; 12, a sample; 13, a sample chamber; 20, a column; 21, an electron gun; 22a to 22e, lenses; 27a, a blanking plate; and 27b, 27c, aperture masks.

Now, explanation will be given below about a basic operation of the apparatus. An electron beam emitted from the electron gun 21 is sent via the deflector 23 to the blanking plate 27a. With the deflector 23 ON, the electron beam is blanked by the blanking plate 27a. With the deflector 23 OFF, the electron beam is not blanked by the blanking plate 27a. By controlling an ON time (or OFF time) by the blanking control circuit 7, it is possible to adjust the exposure time of the exposure beam. The exposure dose depends upon the exposure time. The exposure beam, being passed through the blanking plate 27a, is shaped into a rectangular beam of any given size by the deflector 24 and aperture masks 27b, 27c.

The shaped electron beam is deflected by the deflectors 25 and 26 serving as a main deflector and sub-deflector, respectively. By varying the deflection angle with the time, it is possible to move (scan) the electron beam on the sample 12, so that patterns is drawn on the sample through scanning.

Now explanation will be given about the control method. The host computer 1 supplies pattern data to the exposure pattern development circuit 2. The exposure pattern development circuit 2 develops the pattern data and the size data and exposure position data of the respective patterns are supplied to the exposure pattern division circuit 4.

Normally, one exposure pattern is larger than a maximum spot size of the electron beam and, for this reason, the exposure pattern division circuit 4 divides the exposure pattern into pattern elements of a size smaller than the spot size. The electron beam is scanned on the sample one shot at a time along the shape of the exposure pattern, while shifting its exposure position little by little in a repeated fashion, so as to form one exposure pattern.

The exposure pattern division circuit 4 supplies the exposure position data of the pattern element to the deflection control circuit 8 and the size data of the pattern element to the variable shaped beam size control circuit 6. Further, both data are supplied to the exposure dose correction circuit.

The exposure dose correction circuit 5 calculates a back scattering dose on the basis of the distribution of the pattern elements on the sample surface and corrects that exposure time on the basis of the back scattered dose. The blanking control circuit 7 controls the blanking time in accordance with the corrected exposure time.

The deflection control circuit 8 drives the deflectors 25 and 26 in accordance with the exposure position data of the pattern element so as to allow the electron beam to be projected on the sample at a given position. The variable shaped beam size control circuit 6 drives the beam shaping deflector 24 on the basis of the size data of the pattern element, so that the electron beam is projected on the sample 12 as a specific spot size.

Figure 3:
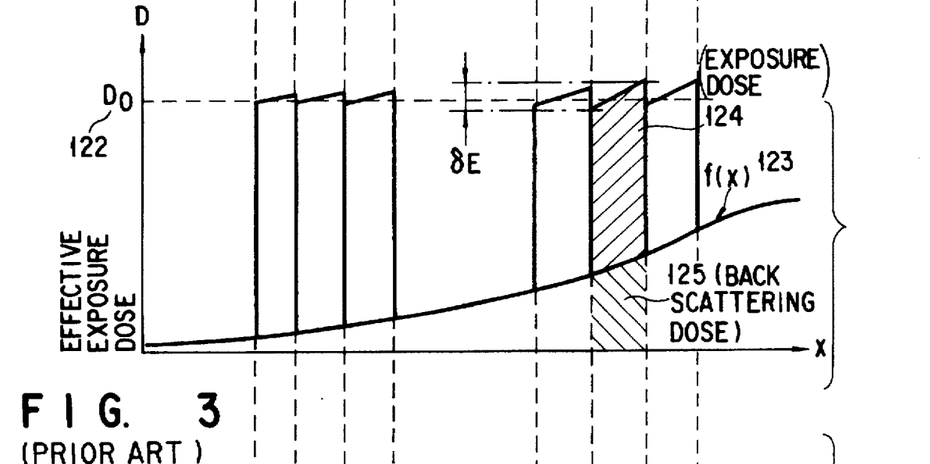
FIG. 3 is a view showing an effective exposure dose for the conventional exposure dose method.
Figure 4:
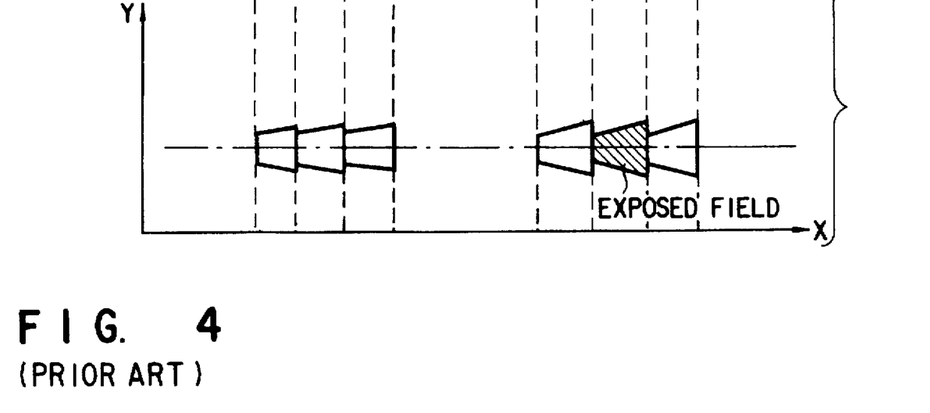
FIG. 4 is a view showing the shape of an exposure field upon actual exposure for the conventional exposure correction method.

With respect to FIGS. 2 to 4, explanation will be given about the principle on which the exposure dose is corrected. Here, explanation will be given below about the case where one exposure pattern is divided into three pattern elements.

In order to alleviate the proximity effect, the electron beam exposure dose correction is made on the basis of a storage charge amount (hereinafter referred to as a back scattered dose) resulting from a back scattering beam from nearly pattern elements.

Figure 2:
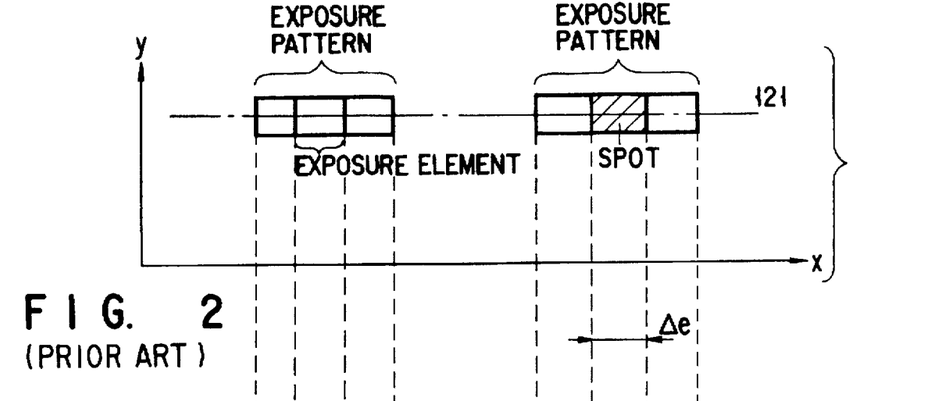
FIG. 2 is a view showing a spot shape of an electron beam for a conventional exposure dose correction method.

FIG. 2 shows an area (hereinafter referred to as a spot) on a sample on which an electron beam is projected. FIG. 3 shows an electric charge amount (exposure dose) 124 directly given from the electron beam, a back scattering dose 125 resulting from the back scattering, and a function f(x) representing a time variation of the back scattering dose relating to the center line of the exposure pattern of FIG. 2. Reference numeral 122 represents an ideal exposure dose $D_0$. In this connection it is to be noted that an effective exposure dose depends upon the total of the exposure dose 124 and back scattering dose 125 and that the exposure dose correction means correct the exposure dose so as to have a total (effective exposure dose) of the exposure dose 124 and back scattering dose 125 approximate an ideal exposure dose $D_0$.

With respect to FIGS. 5 and 6, explanation will be given about the method for controlling the conventional exposure dose correction. In order to determine the exposure time, the back scattering dose is necessary. The back scattering dose may be calculated, as well known, in accordance with the exposure pattern, neighboring state of the exposure patterns, reflectance of the substrate, and so on. In order to decrease this amount of calculation, the sample surface is divided in actual practice into meshes a few µm square and the back scattering dose is calculated with respect to the meshes. And based on the back scattering dose the exposure time is corrected for each dose. The calculations and corrections, together with the "drawing" operation, incur longer operation time. Therefore, these have been initially finished before the "drawing" operation and the exposure time data have been stored in memory. During the "drawing" operation, the exposure time data are sequentially read out of the memory. During the read time, the mesh containing an exposure position of the pattern element 113 is determined as shown in FIG. 5.

Figure 5:
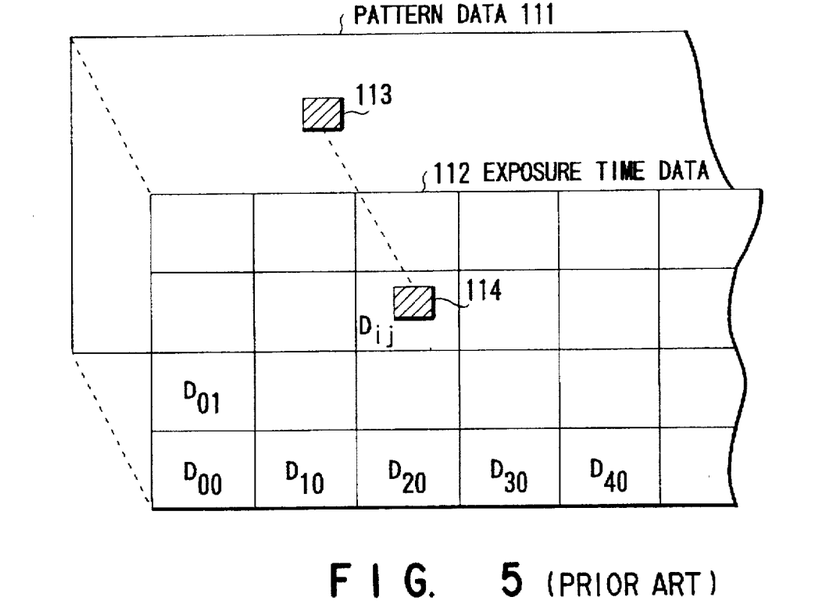
FIG. 5 is a conception view showing exposure time data.
Figure 6:
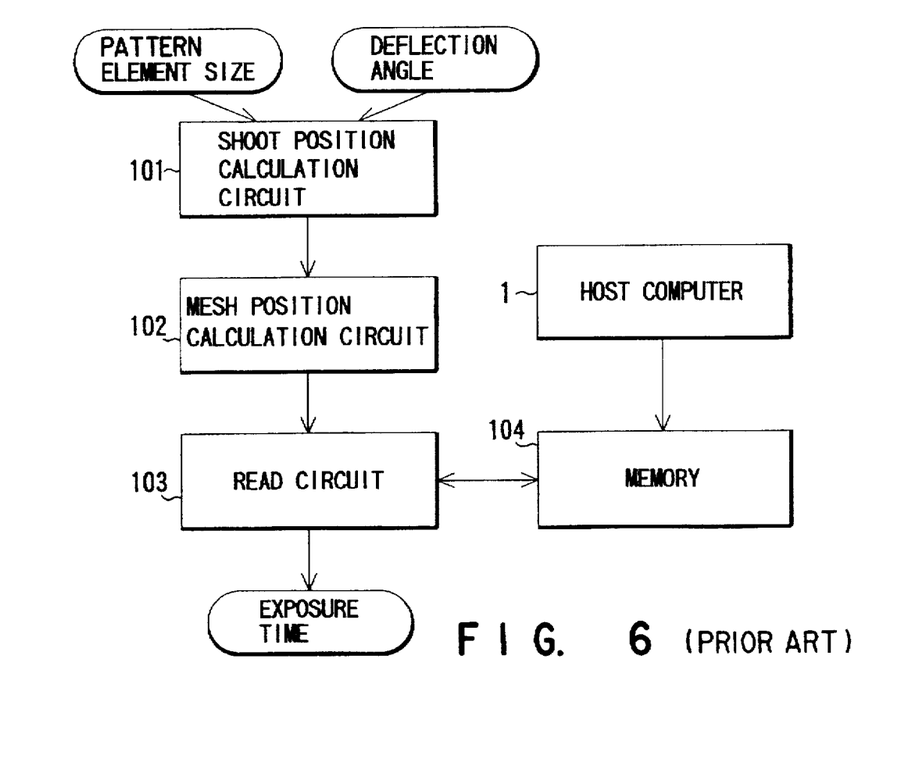
FIG. 6 is a block diagram showing an arrangement of the conventional exposure dose correction circuit.

In the exposure of the pattern element as shown in FIG. 5, the exposure center position (shot position) of the pattern element is found, by a shot position calculation circuit 101, based on the pattern element size and pattern element position as shown in FIG. 6. Then, the mesh corresponding to the shot position is specifically determined by a mesh position calculation circuit 102. And the exposure time data 114 corresponding to the found mesh is read, by a read circuit, out of the memory 104 and output to the blanking control circuit 7 in FIG. 1.

In order to improve the drawing accuracy of the electron beam lithography apparatus it is necessary to enhance the accuracy with which the exposure dose of the electron beam is corrected. In order to enhance the accuracy of the exposure dose correction it is better to reduce the mesh size. If this is done, the calculation of the back scattering dose and processing amount relating to the exposure time correction are increased, thus posing the problem of a longer access time.

Further, the back scattering dose in one exposed field, being very small, is not constant and, in consequence, distortion appears in the exposed field causes, for example, the edges of the thin lines to be unevenly jagged. This problem can be alleviated by reducing the size of the pattern elements to a minimal possible extent. If, however, the size of the pattern element is made smaller, more shots (more pattern elements) are required and the "drawing" throughput is lowered.

Further, a multi-exposure method is also used as a method for improving the pattern accuracy of the exposure area. The multi-exposure method is the technique which averages the distortions of a spot shape by the amplifier's noise, etc., of the deflector by repeatedly exposing the same area of a sample, a few times, with a beam. In the case where the multi-exposure method and exposure dose correction method are used in combination, it may be possible that the exposure time found at the exposure dose correction circuit 5 is divided by the number of the exposures and the result is used as the exposure time (shot time) corresponding to one shot.

When, on the other hand, the exposure time is divided by the number of shots, there will occur a quantization error corresponding to that result time and a fall in exposure accuracy resulting from an underexposure caused by such an error will occur.

BRIEF SUMMARY OF THE INVENTION

It is accordingly the object of the present invention to provide an electron beam lithography apparatus and method which can improve exposure accuracy, also can improve drawing-throughput.

According to the present invention, it is possible to diminish the distortion of an exposed field, by adjusting the size of pattern elements, in accordance with a gradient of a spatial variation of a back scattering dose and hence to approximate an uneven edge of an exposed field array to a linear edge. If the division sizes of the exposure patterns are made uniformly smaller, the "drawing" throughput is markedly lowered. According to the present invention, the sizes of the pattern elements vary in accordance with the gradient of a spatial variation of a back scattering dose and it is, therefore, possible to avoid an extreme deterioration in the "drawing" throughput.

Further, according to the present invention, a remaining time obtained by dividing a total exposure amount by the number of shots at a multi-exposure step is compensated for by at least one shot. It is, therefore, possible to have a total exposure amount correspond to an ideal one and, by doing so, to cancel underexposure.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be explained below with respect to the accompanying drawings.

Figure 7:
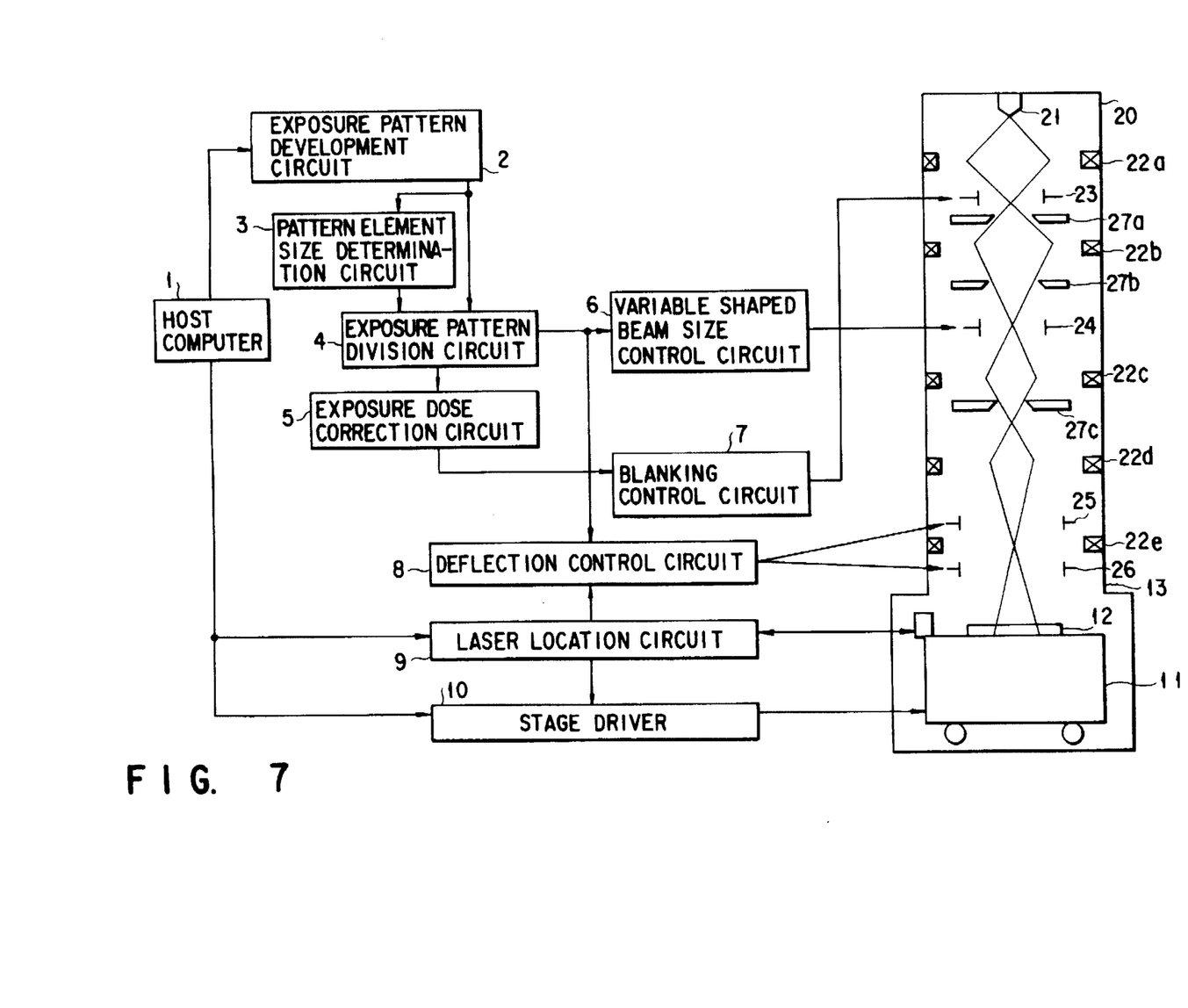
FIG. 7 is a view showing an arrangement of an electron beam lithography apparatus according to a preferred embodiment of the present invention.

An electron beam lithography apparatus according to an embodiment of the present invention will be explained below with reference to FIG. 7. The electron beam lithography apparatus of the present invention is of a variable shaped beam type. One exposure pattern is divided into a plurality of pattern elements. By directing an electron beam one shot at a time, a sample is exposed at a corresponding pattern element. By shifting the electron beam little by little from one position to another in a repeated fashion, scanning is made on the sample along those pattern elements in a collective unit.

Reference numeral 1 shows a host computer; 2, a exposure pattern development circuit; 3, a pattern element size decision circuit; 4, a exposure pattern division circuit; 5, a exposure pattern dose correction circuit; 6, a variable shaped beam size control circuit; 7, a blanking control circuit; 8, a deflection control circuit; 9, a laser location circuit; 10, a stage driver; 11, a stage; 12, a sample; 13, a sample chamber; 20, a column; 21, an electron gun; 22a to 22e, lenses in a lens system; 23 to 26, deflectors; 27a, a blanking plate; and 27b, 27c, beam shaping aperture masks.

An electron beam lithograph apparatus of the present embodiment differs from a conventional apparatus in that the pattern element size determining circuit 3 is added and that the exposure dose correcting circuit 5 is different in arrangement from that in the apparatus shown in FIG. 1. The basic operation of the present embodiment will be explained below with reference to the accompanying drawings. An electron beam emitted from the electron gun 21 is sent via the deflector 23 to a blanking plate 27a. With the deflector 23 ON, the electron beam is blanked by the blanking plate 27a. With the deflector 23 OFF, the electron beam is not blanked by the blanking plate 27a. By controlling the ON time (or OFF time) by the blanking control circuit 7, it is possible to control the exposure time of the electron beam. In this connection it is to be noted that a storage charge amount (exposure dose) depends upon the exposure time. The electron beam passing through the blanking plate 27a is shaped into a rectangular beam of any given size by the deflector 24 and aperture masks 27b, 27c.

The shaped electron beam is deflected by the deflectors 25 and 26 serving as a main deflector 25 and sub-deflector, respectively. By varying the deflection angle with the time, it is possible to move (scan) the electron beam on the sample 12, so that a pattern is drawn on the sample 12.

The basic operation of the present embodiment will be explained below.

The host computer 1 supplies pattern data to the exposure pattern development circuit 2. The exposure pattern development circuit 2 develops the pattern to a plurality of exposure patterns and the size data and exposure position data of the respective exposure patterns are supplied to the pattern element size decision circuit 3 and exposure pattern division circuit 4.

Normally, one exposure pattern is larger than a maximum spot size and, for this reason, it is divided by the exposure pattern division circuit 4 into pattern elements smaller in size than the spot size. The electron beam exposes a part of the sample to the shape of the pattern element, while shifting its exposure position little by little in a repeated fashion it is possible to form one exposure pattern. However, when one exposure pattern is smaller than the maximum spot size, the pattern division is not performed.

The pattern element size decision circuit 3 calculates the spatial distribution of back scattering doses on the basis of the distribution of the pattern elements on the sample surface, reflectance of the substrate, and so on, and determines the size of the pattern element on the basis of a gradient of a spatial variation in the back scattering dose. Simply, the size of the pattern element is made relatively small at a relatively abrupt gradient position and the size of the pattern element is made relatively large at a relatively gentle gradient position.

The reason is as set out below. The distortion at an actual exposure area is great in the case where the gradient of the spatial variation of the back scattering dose is at a relatively abrupt position while, on the other hand, it is relatively small in the case where the gradient is at a relatively gentle position. In consequence, the pattern element size is made small at a great distortion position, so that any prominent distortion is prevented by the exposure of that small area. At the larger distortion position, on the other hand, the pattern element size is made relatively great and, by the exposure of the relatively great area with the beam, an increase in the number of shots is suppressed and a lowering in the "drawing" throughput is suppressed.

The exposure pattern division circuit 4 divides the exposure pattern into a plurality of pattern elements. The exposure pattern division circuit 4 supplies exposure position data of the pattern element to the deflection control circuit 8 and the size data of the pattern element is supplied to the variable shaped beam size control circuit 6. Both data are supplied to the exposure dose correction circuit 5. However, when one exposure pattern is smaller than the determined size of the pattern element, the exposure pattern division circuit 4 supplies exposure position data of the exposure pattern (not pattern element) to the deflection control circuit 8 and supplies the size data of the exposure pattern (not pattern element) to the variable shaped beam size control circuit 6.

The exposure dose correction circuit 5 calculates a back scattering dose based on the distribution of the pattern elements on the sample surface and determines the exposure dose (exposure time) at each pattern element (at each shot) on the basis of the back scattering dose and ideal exposure dose. That is, the exposure dose correction circuit 5 corrects the exposure time so as to have a total of the back scattering dose and exposure dose approximate the ideal exposure dose. The blanking control circuit 7 controls a blanking time in accordance with the corrected exposure time.

The deflection control circuit 8 drives the deflectors 25, 26 in accordance with exposure position data of the pattern element, so that the electron beam is projected on the sample at a specific position. The variable shaped beam size control circuit drives a beam shaping deflector 24 based on the size data of the pattern element, so that the electron beam is projected on the sample 12 at a specific spot size.

In determining the maximum size of the pattern element by the pattern element size decision circuit 3 it may be possible to finally determine the size of the pattern element by the exposure pattern division circuit 4 with the degree of freedom below the maximum size.

Figure 8:
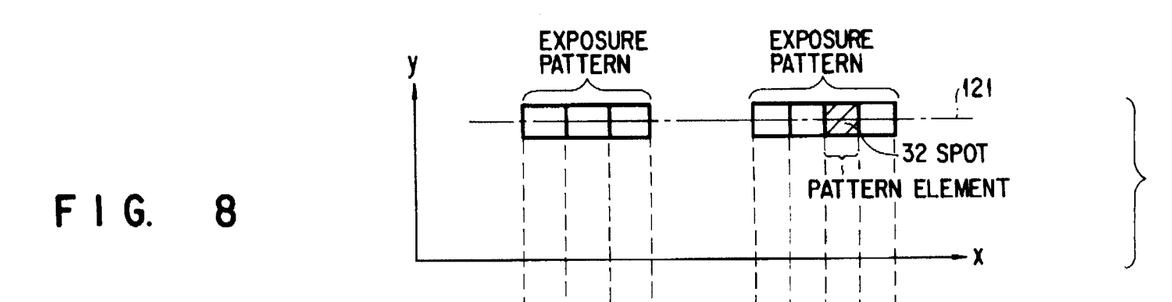
FIG. 8 is a view showing a spot shape of an electron beam for an exposure dose method of the present invention.
Figure 9:
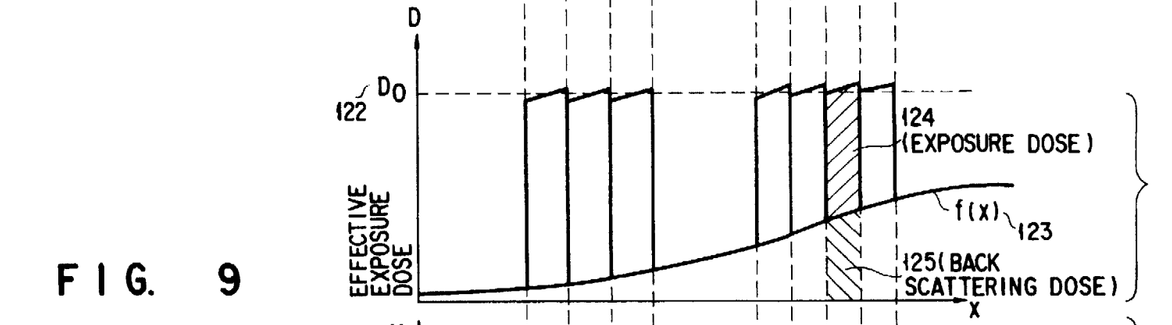
FIG. 9 is a view showing an effective exposure dose for the exposure dose correction method of the present invention.

Now, explanation will be given below about determining the pattern element size. FIG. 8 shows the shape of an electron beam's spot projected on the sample 12. In this example, two exposure patterns are divided one into three and the other into four pattern elements. FIG. 9 shows an exposure dose 124, that is, a charge amount stored in a resist directly from the electron beam and a back scattering dose 125, that is, a charge amount stored in the resist indirectly from the back scattering dose. In this connection it is to be noted that, in FIG. 9, f(x) represents a spatial variation of the back scattering dose 125. Reference numeral 122 represents an ideal exposure dose $D_0$. The effective exposure dose depends upon the total of the exposure dose 124 and back scattering dose 125.

As explained in connection with the background art, the exposure dose (exposure time) of the electron beam when the pattern element is exposed is corrected in accordance with a difference between $D_0$ and the f(x). However, the distortion of the actual exposure area will become larger at a position where the gradient of the f(x) is larger.

According to the present embodiment, in a position where the gradient of the f(x) is relatively abrupt, the exposure area is made relatively small by making the pattern element relatively small. In a position where the gradient of the f(x) is relatively gradual, on the other hand, the exposure area is made relatively great by making the pattern element relatively great. Although two exposure patterns of the same size are shown in FIG. 8, it is to be noted that the number of divisions differ between both depending upon the difference of the gradient of the f(x) at their respective places. The left exposure pattern exposed at a position where the gradient of the f(x) is gradual is divided into three pattern elements, while, on the other hand, the right exposure pattern exposed at a position where the gradient of the f(x) is abrupt is divided into four pattern elements.

Figure 10:
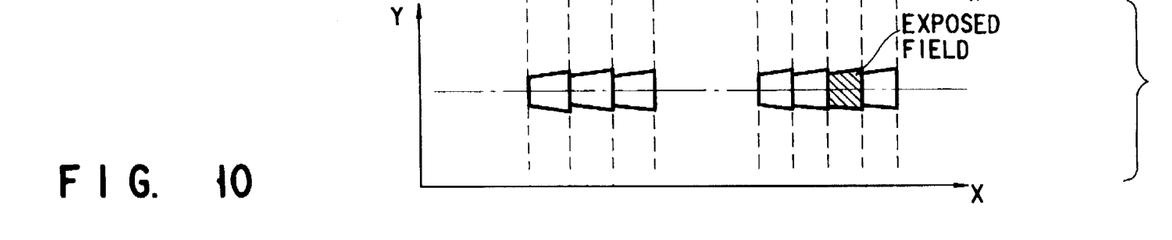
FIG. 10 is a view showing the shape of an exposure field upon actual exposure by the exposure dose correction method of the present invention.

Even when the exposure pattern is so divided, the actual exposure dose level becomes step-like as shown in FIG. 9, but the stepped area is within a given value. As shown in FIG. 10, the distortion of the actually exposed area (hereinafter referred to as the exposure field), for example, a ratio of a minimal side length to a maximal side length of the exposure field, is held below a predetermined allowance level.

Figure 11:
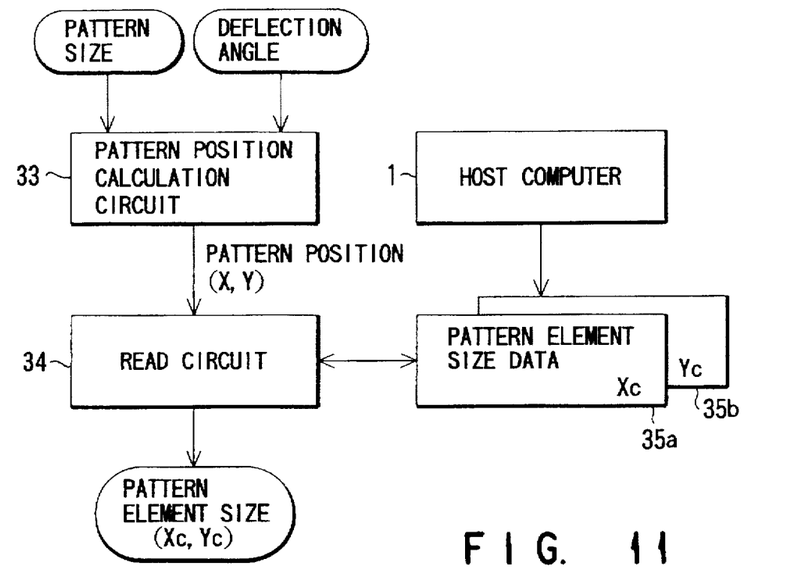
FIG. 11 is a block diagram showing an arrangement of a pattern element size determining circuit in FIG. 7.

FIG. 11 is a block diagram showing a practical form of the pattern element size decision circuit 3. The pattern element size decision circuit 3 has memories 35a, 35b. The spatial distribution of the back scattering dose may be calculated, as well known in the art, in accordance with the neighboring state of the pattern element, reflectance of the substrate, and so on. In order to decrease an amount of calculation, the sample surface is divided into meshes of a few μm square and the back scattering dose is calculated on the respective meshes. And the pattern element size is calculated at each mesh on the basis of the gradient of the back scattering dose among meshes. Since effecting calculation is parallel with the "drawing" operation takes more operation time, it is done before the "drawing" operation and the result of calculation is initially stored in the memories 35a, 35b. During the "drawing" operation, the pattern element size data are sequentially read out of the memories 35a, 35b.

The reading of the pattern element size is done, by the read circuit 34, using, as an address, the exposure pattern position (the center position of the exposure pattern) calculated by a exposure pattern position calculation circuit 33 based on the exposure pattern size and exposure pattern position.

Figure 12:
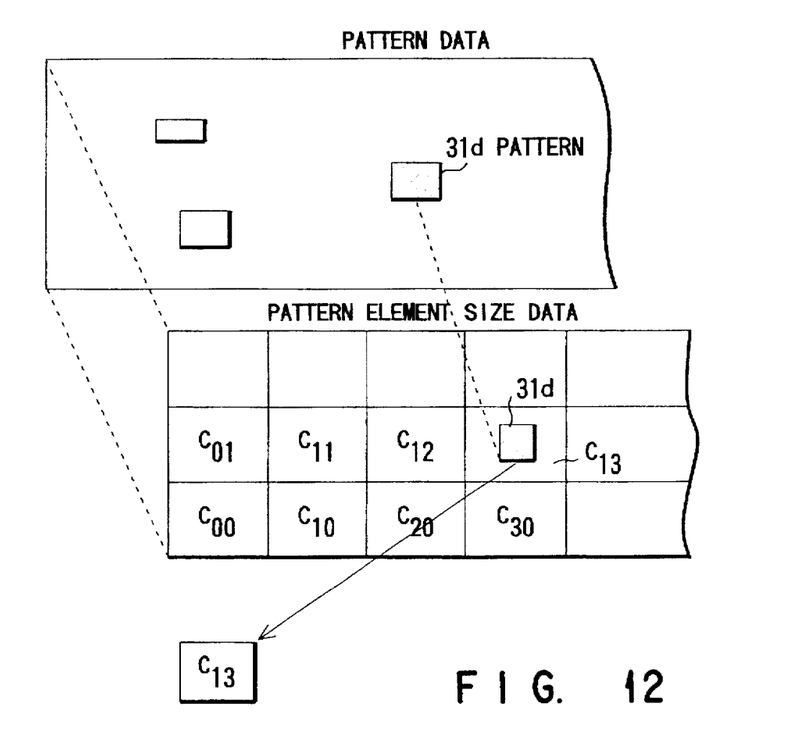
FIG. 12 is a conception view showing pattern element size data stored in memory in FIG. 11.

In the case where, for example, the pattern element of the exposure pattern 31d is found, the data (pattern element size) C13 corresponding to the position of the exposure pattern 31d is read out.

Figure 13:
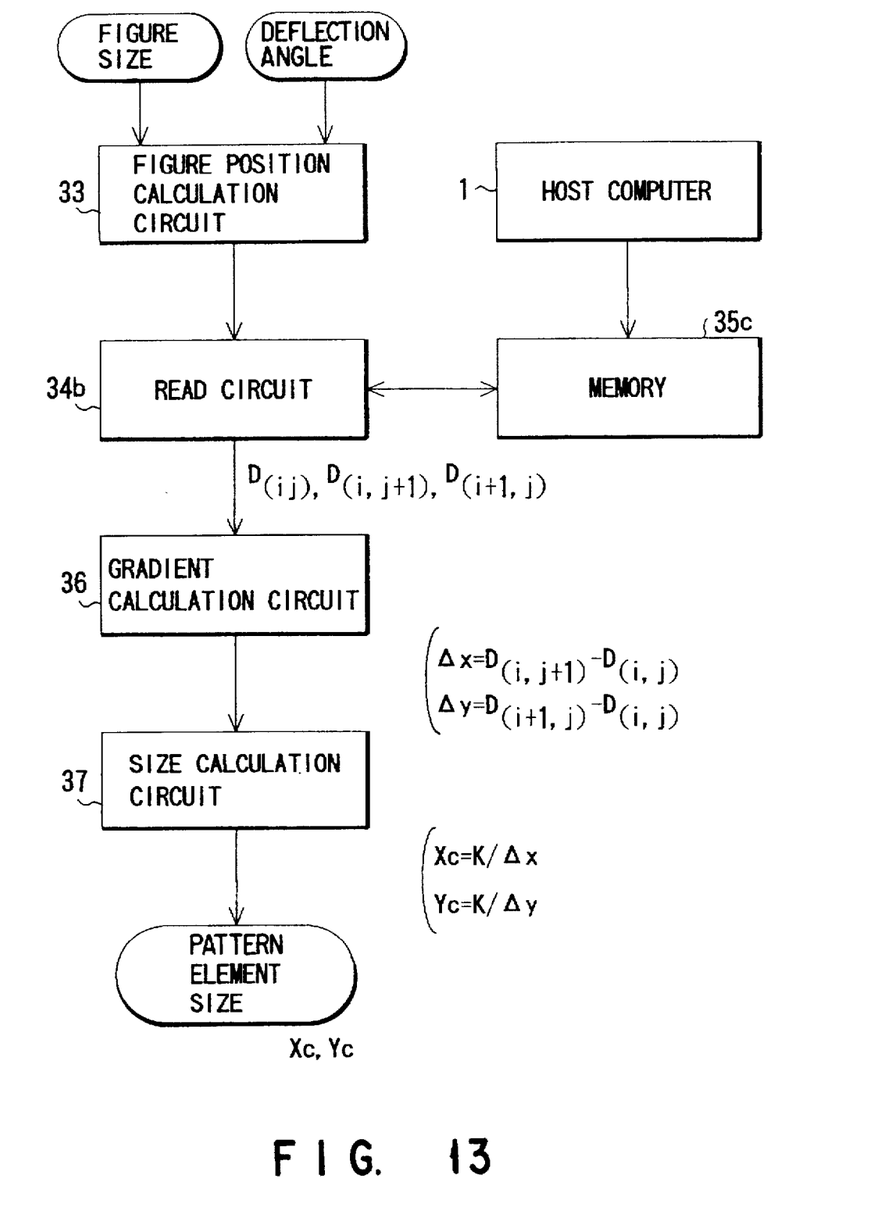
FIG. 13 is a block diagram showing another form of a pattern element size decision circuit in FIG. 7.

FIG. 13 is a block diagram showing another practical form of the pattern element size decision circuit 3.

This practical form is of such a type that calculation is made on the circuit without initially preparing the pattern element size data. A exposure pattern position calculation circuit 33 is of the same type as shown in FIG. 11. The read circuit 34b allows a read-in of the exposure dose data $D_{(i, j)}$ corresponding to the exposure pattern position and adjacent data $D_{(i, j+1)}$ and $D_{(i+1, j)}$ out of a memory 35c storing the exposure dose data of the exposure pattern corrected based on the back scattering dose. A gradient calculation circuit 36 takes a difference between them as shown in each of the following equations (1) and (2) and calculates the gradients $\Delta x$, $\Delta y$ of the exposure doses.

$$\Delta x = D_{(i, j+1)} - D_{(i, j)} \quad (1)$$

$$\Delta y = D_{(i+1, j)} - D_{(i, j)} \quad (2)$$

A size calculation circuit 37 calculates the pattern element sizes (Xc, Yc) from the gradients $\Delta x$, $\Delta y$ with the use of the following equations (3), (4).

$$Xc = K/\Delta x \quad (3)$$

$$Yc = K/\Delta y \quad (4)$$

The exposure dose levels stored in the memory 35c are corrected based on the back scattering doses and the gradient of the exposure dose at the adjacent position corresponds to that of a spatial variation in the back scattering dose. The result of the calculation is equal to, or very close to, the pattern element size on the basis of the gradient of the spatial change in the back scattering dose.

In the case where the mesh interval of the exposure dose data is adequately smaller than the exposure pattern data, it follows that, with the exposure dose data corresponding to the exposure pattern being all read in, the above-mentioned calculations are done to find the gradients $\Delta x$, $\Delta y$ at the respective points and the maximum gradient data is adopted.

Figure 14:
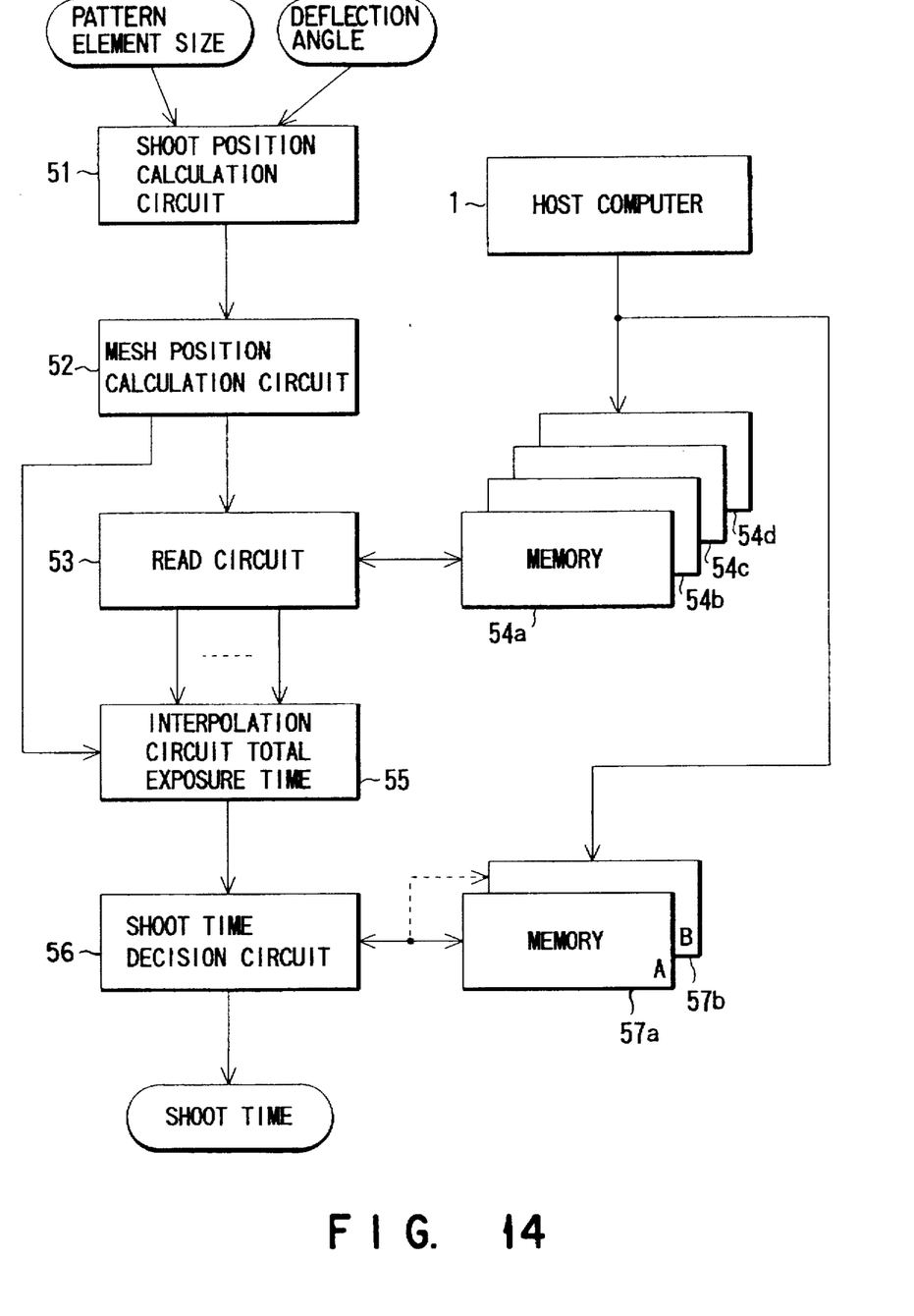
FIG. 14 is a block diagram showing an arrangement of an exposure dose correction circuit in FIG. 7.

FIG. 14 is a block diagram showing an arrangement of the exposure dose correction circuit 5. In order to determine the exposure time, the back scattering dose is necessary. The back scattering dose, as well known in the art, may be calculated in accordance with the neighboring state of the pattern element, reflectance of the substrate, and so on. In order to reduce amounts of calculation, the sample surface is divided in actual practice into meshes of a few μm square and the back scattering dose is calculated on the respective mesh. Based on the back scattering dose the exposure time is corrected at each mesh. Since these calculations and corrections, in parallel with the "drawing" operation, take more operation time, they are finished before the "drawing" operation and the exposure time data are initially stored in memories 54a, 54b, 54c and 54d. During the "drawing" operation, the exposure time data are sequentially read from these memories.

The exposure center position (shot position) of the pattern element is found, by the shot position calculation circuit 101, based on the pattern element size and exposure position of the pattern element. Then a mesh corresponding to the shot position is specified by the mesh position calculation circuit 52 and the exposure time data corresponding to the meshes are read out by a read circuit 53 from the memories 54a, 54b, 54c and 54d. Here, the time during which such data are read out of these memories 54a to 54d is increased and, when this adversely affects the "drawing" throughput, it may be possible that, with a bank of memories as a unit, the read circuit 53 is connected in parallel with the memories.

According to the present embodiment, the mesh is made larger so as to reduce an exposure time calculation amount. Therefore, the following interpolation processing is added as will be set out below.

Figure 15:
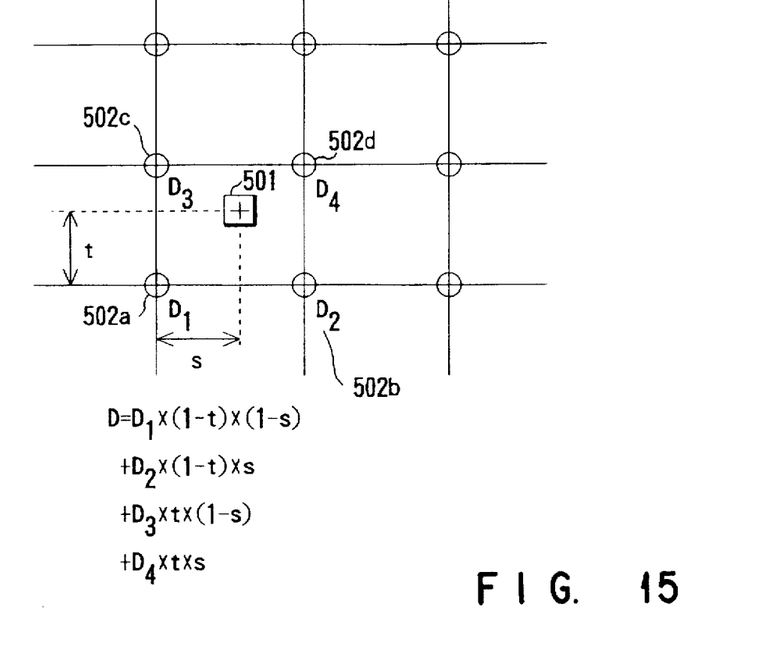
FIG. 15 is an explanatory view showing interpolation processing in an interpolation circuit in FIG. 14.

With reference to FIG. 15, explanation will be given below about the interpolation processing by the interpolation circuit 55. In the case where the exposure time is calculated with respect to a shot position 501, the read circuit 53 allows the read-in of those exposure times $D_1$, $D_2$, $D_3$ and $D_4$ of four meshes 502a, 50b, 50c and 50d around the shot position 501.

The interpolation circuit 55 calculates distances s, t from the shot position 501 to respective meshes 502a, 502b, 502c and 502d. The interpolation circuit 55 finds the exposure time D of the shot position 501 though the interpolation calculation of the following equation (5) from the exposure time data $D_1$, $D_2$, $D_3$, $D_4$ and s, t and outputs it to the shot time decision circuit 56.

$$\begin{aligned} D = & D_1 \times (1-t) \times (1-s) + \\ & D_2 \times (1-t) \times s + \\ & D_3 \times t \times (1-s) + \\ & D_4 \times t \times s \end{aligned} \quad (5)$$

By finding the exposure time by the interpolation processing it is possible to enhance the accuracy of the exposure dose correction without the need to closely find the exposure time.

Although, in the above-mentioned example, the interpolation processing is made with the use of the exposure time data of the four points around the shot, it is possible to enhance the accuracy of the exposure dose correction if interpolation processing is made with the use of more number of read-in exposure time data. Although, as the interpolation processing method, use is made of various methods such as a spline interpolation and linear interpolation, their choice has only to be determined from a trade-off between the requirement accuracy and the circuit size.

Explanation will be given about a shoot time decision circuit 56. This circuit 56 is started in a "multi-exposure" case, that is, in a case where exposure is made on the sample surface, a few spots at a time, at the same area so as to average distortions of the exposed areas. The shoot time decision circuit 56 allocates the exposure time (total exposure time) calculated by the interpolation circuit 55 to respective shots and determines the shot times of the respective shots.

In this case, it is possible to find the exposure time (shot time) per shot by dividing the total exposure time by the number of exposures (number of shots). Simple divide-operation leaves a remaining time, so that the phenomenon "underexposure" occurs due to a non-coincidence between the total of those shot times involved and the total exposure time. This problem is analogous to a quantization error.

In the shoot time decision circuit 56, the underexposure resulting from the remaining time is compensated for by the shot time of at least one shot. That is, the shot time of at least one shot is more extended, by such a remaining time, than the shot time left by the simple divide-operation. This procedure may be realized by the corresponding calculation. Here, the extended time above can be determined by initially making such calculation and storing corresponding data in tabulized form.

Figure 16:
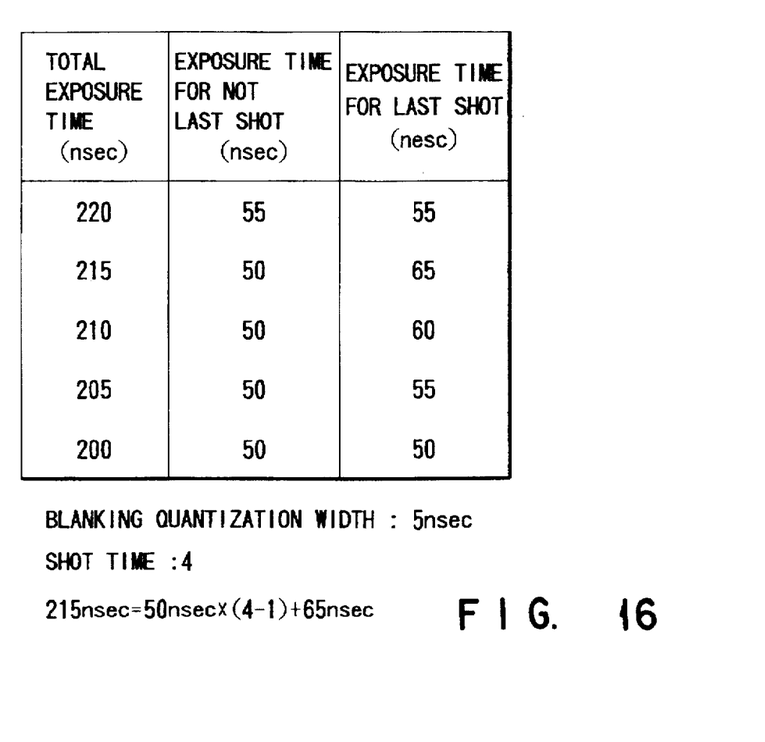
FIG. 16 is a view showing an example of an exposure time division table stored in memory in FIG. 14.

FIG. 16 shows an example of a table stored in memories 57a, 57b. Here, the remaining time above is compensated for by a last shot. Here, if a blanking quantization width (the quantization width of the exposure time data input from the exposure dose correction circuit 5 to the blanking control circuit 7) is 5 nsc, the number of shots (the number of exposures), 4, and the total exposure time, 215 nsec, then the shot time of three shots is set to be 50 nsec and the shot time of a remaining shot to be 65 nsec. In this setting, the underexposure is canceled because the total exposure time coincides with a total of the shot times.

Taking into consideration the case where the calculated exposure time is divided simply by the number of exposure doses in a multi-step, the quotient becomes 53.75 nsec and, since the quantization with is 5 nsec, the exposure time data at the four respective lithography times becomes 50 nsec. As a result, there occurs an error: 215−(50×4)=15 nsec.

By preparing a plurality of tables each having a different number of shots, it is possible to unconditionally specify the shot time of respective shots from the total exposure time and number of shot times.

As set out above, according to the electron beam lithography apparatus, it is possible to alleviate the distortion of the exposure area, while suppressing a fall in the "drawing" throughput.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An electron beam lithography apparatus for drawing an exposure pattern on a sample, said electron beam lithography apparatus comprising:

pattern development means for outputting position and size of the exposure pattern;

means for determination division size of the exposure pattern on the basis of the position of the exposure pattern and a gradient of a spatial variation of a back scattering dose;

means for dividing the exposure pattern into a plurality of pattern elements in accordance with the determined division size; and means for determining an exposure dose of the electron beam at each pattern element.

2. The electron beam lithography apparatus according to claim 1, wherein the exposure dose determination means is means for determining an exposure time of the electron beam based on the exposure dose.

3. The electron beam lithography apparatus according to claim 2, wherein the exposure dose determination means determines the shot time of respective shots so as to, when the pattern element on the sample is exposed with the electron beam by directing the electron beam to the same area on the sample in a repeated fashion, allow a remaining time which is obtained by dividing an exposure time by the number of shots to be compensated for by at least one shot.

4. The electron beam lithography apparatus according to claim 3, wherein the shot time determination means determines the shot time of one shot to a total time of the remaining time and the time obtained by dividing the exposure time by the number of shots and determines the shot time of a remaining shot to a time obtained by dividing the exposure time by the number of shots.

5. The electron beam lithography apparatus according to claim 1, wherein the size determination means makes the size of the pattern element relatively small when the gradient is relatively abrupt, and makes the size of the pattern element relatively large when the gradient is relatively gradual.

6. The electron beam lithography apparatus according to claim 1, wherein the size determination means determines size of the pattern element on the basis of the gradient at a position on the sample on which the exposure pattern is drawn.

7. The electron beam lithography apparatus according to claim 1, wherein the size determination means calculates size of the pattern element on the basis of a spatial gradient of an exposure dose subjected to back scattering correction.

8. The electron beam lithography apparatus according to claim 1, wherein said means for determining the exposure dose calculates the exposure dose of the pattern element, by an interpolation, from an exposure dose relating to a plurality of positions adjacent the exposure position of the pattern element.

9. An electron beam lithography apparatus for drawing an exposure pattern on a sample, said electron beam lithography apparatus comprising:

pattern development means for outputting position and size of the exposure pattern;

means for determining division maximum size of the exposure pattern on the basis of the position of the exposure pattern and a gradient of a spatial variation of a back scattering dose;

means for dividing the exposure pattern into a plurality of pattern elements in accordance with the determined division maximum size, the size of pattern elements being within the determined division maximum size; and means for determining an exposure dose of the electron beam at each pattern element.

10. The electron beam lithography apparatus according to claim 9, wherein the exposure dose determination means is means for determining an exposure time of the electron beam based on the exposure dose.

11. The electron beam lithography apparatus according to claim 10, wherein the exposure dose determination means determines the shot time of each shot so as to, when the pattern element on the sample is exposed with the electron beam by directing the electron beam to the same area on the sample in a repeated fashion, allow a remaining time which is obtained by dividing an exposure time by the number of shots to be compensated for by at least one shot.

12. The electron beam lithography apparatus according to claim 11, wherein the shot time determination means determines the shot time of one shot to a total time of the remaining time and a time obtained by dividing the exposure time by the number of shots and determines the shot time of a remaining shot to a time obtained by dividing the exposure time by the number of shots.

13. The electron beam lithography apparatus according to claim 9, wherein the maximum size determination means makes the maximum size relatively small when the gradient is relatively abrupt and makes the maximum size relatively great when the gradient is relatively gradual.

14. The electron beam lithography apparatus according to claim 9, wherein the maximum size determination means determines the maximum size on the basis of the gradient at a position on the sample on which the exposure pattern is drawn.

15. The electron beam lithography apparatus according to claim 9, wherein the maximum size determination means calculates the maximum size on the basis of a spatial gradient of the exposure dose subjected to back scattering correction.

16. The electron beam lithography apparatus according to claim 9, wherein the exposure dose determination means calculates the exposure dose of the pattern element, by an interpolation, from an exposure dose relating to corresponding positions near the exposure positions of the pattern element.

17. An electron beam lithography apparatus for drawing a exposure pattern on a sample by directing an electron beam on the same area of the sample in a repeated fashion, comprising:

means for determining an exposure time of the electron beam for drawing the exposure pattern; and means for determining a shot time of each shot so as to allow a remaining time which is obtained by dividing the exposure time by the number of shots to be compensated for by at least one shot.

18. The electron beam lithography apparatus according to claim 17, wherein the shot time determination means determines the shot time of one shot to a total time of the remaining time and the time obtained by dividing the exposure time by the number of shots and determines the exposure time to a time obtained by dividing the exposure time by the number of shots.

19. The electron beam lithography apparatus according to claim 17, wherein the shot time determination means calculates the exposure time of the exposure pattern, by an interpolation, from exposure times relating to a plurality of positions near a drawing position of the exposure pattern.

20. An electron beam lithography method for drawing an exposure pattern on a sample, said electron beam lithography method comprising:

a step (A) for outputting position and size of the exposure pattern;

a step (B) for determining division size of the exposure pattern on the basis of the position of the exposure pattern and a gradient of a spatial variation of a back scattering dose;

a step (C) for dividing the exposure pattern into a plurality of pattern elements in accordance with the determined division size; and a step (D) for determining an exposure dose of the electron beam at each pattern element.

21. The electron beam lithography apparatus according to claim 20, wherein the step (D) includes a step (E) of determining an exposure time of the electron beam based on the exposure dose.

22. The electron beam lithography method according to claim 21, wherein the step (E) includes a step (F) of determining a shot time of each shot so as to, when the pattern element on the sample is exposed with the electron beam by directing the electron beam to the same area on the sample in a repeated fashion, allows a remaining time which is obtained by dividing an exposure time by the number of shots to be compensated for by at least one shot.

23. The electron beam lithography method according to claim 22, wherein the step (F) includes step of determining the shot time of one shot to a total time of the remaining time and the time obtained by dividing the exposure time by the number of shots and determining the shot time of a remaining shot to a time obtained by dividing the exposure time by the number of shots.

24. The electron beam lithography method according to claim 20, wherein the step (B) includes a step of making the size of the pattern element relatively small when the gradient is relatively abrupt and the size of the pattern element relatively great when the gradient is relatively gradual.

25. The electron beam lithography method according to claim 20, wherein the step (B) includes a step of determining size of the pattern element on the basis of the gradient at a position on the sample on which the exposure pattern is drawn.

26. The electron beam lithography method according to claim 20, wherein the step (B) includes a step of calculating size of the pattern element on the basis of a spatial gradient of an exposure dose subjected to a back scattering correction.

27. The electron beam lithography method according to claim 20, wherein the step (D) includes a step of calculating an exposure dose of the pattern element, by an interpolation, from exposure dose relating to a plurality of positions near an exposure position of the pattern element.

28. An electron beam lithography method for drawing an exposure pattern on a sample, said electron beam lithography method comprising:

a step (A) for outputting position and size of the exposure pattern;

a step (B) for determining division maximum size of the exposure pattern on the basis of the position of the exposure pattern and a gradient of a spatial variation of a back scattering dose;

a step (C) for dividing the exposure pattern into a plurality of pattern elements in accordance with the determined division maximum size, the size of pattern elements being within the determined division maximum size; and a step (D) for determining an exposure dose of the electron beam at each pattern element.

29. The electron beam lithography apparatus according to claim 28, wherein the step (D) includes a step (E) of determining an exposure time of the electron beam based on the exposure dose.

30. The electron beam lithography method according to claim 29, wherein the step (E) includes a step (F) of determining a shot time of each shot so as to, when the pattern element on the sample is exposed with the electron beam by directing the electron beam to the same area on the sample in a repeated fashion, allow the remaining time which is obtained by dividing an exposure time by the number of shots to be compensated for by at least one shot.

31. The electron beam lithography method according to claim 30, wherein the step (F) includes a step for determining a shot time of one shot to a total time of the remaining time and a time obtained by dividing the exposure time by the number of shots and determining the exposure time to a time obtained by dividing the exposure time by the number of shots.

32. The electron beam lithography method according to claim 28, wherein the step (B) includes a step of making the maximum size relatively small when the gradient is relatively abrupt and the maximum size relatively large when the gradient is relatively gradual.

33. The electron beam lithography method according to claim 28, wherein the step (B) includes a step of determining the maximum size on the basis of the gradient relative to a position on the sample on which the exposure pattern is drawn.

34. The electron beam lithography method according to claim 28, wherein the step (B) includes a step of calculating the maximum size on the basis of a spatial gradient of the exposure dose subjected to a back scattering correction.

35. The electron beam lithography method according to claim 28, wherein the step (D) includes a step of calculating an exposure dose of the pattern element, by an interpolation, from exposure dose relating to a plurality of positions near the exposure position of the pattern element.

36. An electron beam lithography method for drawing a exposure pattern on a sample by directing an electron beam to the sample at the same area, comprising:

a step (A) for determining an exposure time of an electron beam for drawing the exposure pattern; and a step (B) for determining a shot time of each shot so as to allow a remaining time which is obtained by dividing the exposure time by the number of shots to be compensated for by at least one shot.

37. The electron beam lithography apparatus according to claim 36, wherein the step (B) includes a step of setting the shot time of one shot to a total time of the remaining time and the time obtained by dividing the exposure time by the number of shots and setting the shot time of the remaining shot a time obtained by dividing the exposure time by the number of shots.

38. The electron beam lithography method according to claim 36, wherein the step (B) includes a step of calculating an exposure time of the exposure pattern, by an interpolation, from exposure times relating to a plurality of positions near a drawing position of the exposure pattern.

* * * * *